United States Patent
Van Buskirk et al.

(10) Patent No.: US 6,515,902 B1
(45) Date of Patent: Feb. 4, 2003

(54) METHOD AND APPARATUS FOR BOOSTING BITLINES FOR LOW VCC READ

(75) Inventors: Michael A. Van Buskirk, Saratoga, CA (US); Pau-Ling Chen, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 39 days.

(21) Appl. No.: 09/873,643

(22) Filed: Jun. 4, 2001

(51) Int. Cl.[7] ............................................. G11C 16/04
(52) U.S. Cl. ........................... 365/185.18; 365/185.29; 365/189.09
(58) Field of Search ....................... 365/185.18, 185.29, 365/218, 189.09

(56) References Cited

U.S. PATENT DOCUMENTS 622,779 A  *  4/1899  Saito .......................... 351/76
6,373,325 B1 * 4/2002 Kuriyama ................... 327/536

* cited by examiner

*Primary Examiner*—Vu A. Le
*Assistant Examiner*—Hien Nguyen
(74) *Attorney, Agent, or Firm*—Eschweiler & Associates, LLC

(57) ABSTRACT

A memory device is disclosed having a memory cell in electrical communication with a node, and operative to indicate a binary value associated with data stored in the memory cell during a read operation when a first voltage is applied to the memory cell. The memory device includes a voltage booster connected between the node and a supply voltage which provides a boosted voltage to the node during the read operation, wherein the boosted voltage is greater than the supply voltage. A method is also disclosed for reading data stored in a memory cell, comprising applying a boosted voltage to a node in electrical communication with the memory cell, wherein the boosted voltage is greater that a supply voltage, and sensing a current associated with the memory cell in order to indicate a binary value associated with data stored in the memory cell during a read operation.

20 Claims, 5 Drawing Sheets

METHOD AND APPARATUS FOR BOOSTING BITLINES FOR LOW VCC READ

FIELD OF THE INVENTION

The present invention generally relates to integrated circuits and, in particular, to a method and apparatus for boosting bitlines in performing a memory read operation.

BACKGROUND OF THE INVENTION

Flash and other types of electronic memory devices are constructed of thousands or millions of memory cells, adapted to individually store and provide access to data. A typical memory cell stores a single binary piece of information referred to as a bit, which has one of two possible states. The cells are commonly organized into multiple cell units such as bytes which comprise eight cells, and words which may include sixteen or more such cells, usually configured in multiples of eight. Storage of data in such memory device architectures is performed by writing to a particular set of memory cells, sometimes referred to as programming the cells. Retrieval of data from the cells is accomplished in a read operation. In addition to programming and read operations, groups of cells in a memory device may be erased, wherein each cell in the group is programmed to a known state.

The individual cells are organized into individually addressable units or groups such as bytes or words, which are accessed for read, program, or erase operations through address decoding circuitry, whereby such operations may be performed on the cells within a specific byte or word. The individual memory cells are typically comprised of a semiconductor structure adapted for storing a bit of data. For instance, many conventional memory cells include a metal oxide semiconductor (MOS) device, such as a transistor in which a binary piece of information may be retained. The memory device includes appropriate decoding and group selection circuitry to address such bytes or words, as well as circuitry to provide voltages to the cells being operated on in order to achieve the desired operation.

The erase, program, and read operations are commonly performed by application of appropriate voltages to certain terminals of the cell MOS device. In an erase or program operation the voltages are applied so as to cause a charge to be stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access to other devices in a system in which the memory device is employed.

Flash memory is a type of electronic memory media which can be rewritten and hold its content without power. Flash memory devices generally have life spans from 100K to 1 MEG write cycles. Unlike dynamic random access memory (DRAM) and static random access memory (SRAM) memory chips, in which a single byte can be erased, flash memory is typically erased and written in fixed multi-bit blocks or sectors. Conventional flash memories are constructed in a cell structure wherein a single bit of information is stored in each flash memory cell. In such single bit memory architectures, each cell typically includes a MOS transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

The control gate is connected to a wordline associated with a row of such cells to form sectors of such cells in a typical NOR configuration. In addition, the drain regions of the cells are connected together by a conductive bitline. The channel of the cell conducts current between the source and the drain in accordance with an electric field developed in the channel by the stacked gate structure. In the NOR configuration, each drain terminal of the transistors within a single column is connected to the same bitline. In addition, each flash cell associated with a given bit line has its stacked gate terminal coupled to a different wordline, while all the flash cells in the array have their source terminals coupled to a common source terminal. In operation, individual flash cells are addressed via the respective bitline and wordline using peripheral decoder and control circuitry for programming (writing), reading or erasing functions.

Such a single bit stacked gate flash memory cell is programmed by applying a relatively high voltage to the control gate and connecting the source to ground and the drain to a predetermined potential above the source. A resulting high electric field across the tunnel oxide leads to a phenomena called "Fowler-Nordheim" tunneling. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

For a read operation, a certain voltage bias is applied across the drain to source of the cell transistor. The drain of the cell is the bitline, which may be connected to the drains of other cells in a byte or word group. The voltage at the drain in conventional stacked gate memory cells is typically provided at between 0.5 and 1.0 volts in a read operation. A voltage is then applied to the gate (e.g., the wordline) of the memory cell transistor in order to cause a current to flow from the drain to source. The read operation gate voltage is typically applied at a level between a programmed threshold voltage ($V_T$) and an unprogrammed threshold voltage. The resulting current is measured, by which a determination is made as to the data value stored in the cell.

More recently, dual bit flash memory cells have been introduced, which allow the storage of two bits of information in a single memory cell. The bitline voltage required to read dual bit memory cells is typically higher than that of single bit, stacked gate architecture memory cells, due to the physical construction of the dual bit cell. For example, some dual bit memory cell architectures require between 1.5 and 2.0 volts to properly bias the bitline or drain of such cells in a read operation. Because the voltage applied to the bitline or drain of the memory cell is derived from the memory device supply voltage ($V_{CC}$), the ability to provide the higher bitline voltage required to read the newer dual bit memory cells may be impaired when the supply voltage is at or near lower rated levels. In addition, low power applications for memory devices, such as cellular telephones, laptop computers, and the like, may further reduce the supply voltage available. Accordingly, there is a need for improved memory devices which allow proper reading of single bit and dual bit architecture memory cells, and which operate at reduced supply voltages.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its sole purpose is to present some concepts of the invention in a simplified form as a prelude to the more detailed description that is presented later. The invention provides voltage boost circuitry and methodologies by which appropriate voltage levels may be applied to bitlines of memory cells during memory read operations. The aspects of the invention find application in devices which include dual bit memory cells requiring higher bitline read voltages than single bit cells, and in association with memory devices employed in low supply voltage applications.

A memory device is disclosed having a memory cell in electrical communication with a node, and operative to indicate a binary value associated with data stored in the memory cell during a read operation when a first voltage is applied to the memory cell. The memory device includes a voltage booster connected between the node and a supply voltage which provides a boosted voltage to the node during the read operation, wherein the boosted voltage is greater than the supply voltage. A method is also disclosed for reading data stored in a memory cell, comprising applying a boosted voltage to a node in electrical communication with the memory cell, wherein the boosted voltage is greater that a supply voltage, and sensing a current associated with the memory cell in order to indicate a binary value associated with data stored in the memory cell during a read operation.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
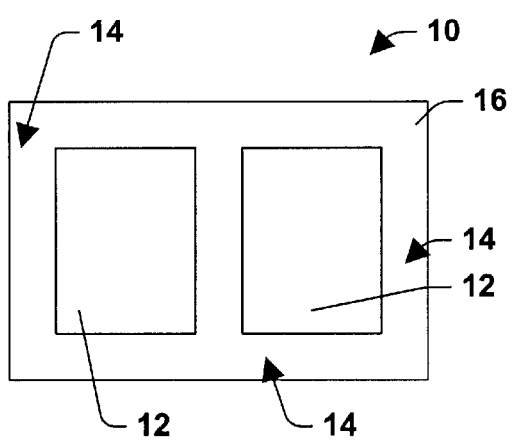
FIG. 1 is a plan view schematically illustrating an exemplary layout of a memory device.

The present invention will now be described with reference to the drawings, wherein like reference numerals are used to refer to like elements throughout. The invention provides a memory device with a memory cell in electrical communication with a node, and operative to indicate a binary value associated with data stored in the memory cell during a read operation when an appropriate bitline voltage is applied to the memory cell. The memory device comprises a voltage booster which provides a boosted voltage to the node during the read operation, wherein the boosted voltage is greater than the supply voltage. This allows proper read operations with respect to the memory cell of interest in the device, even where the supply voltage is not high enough to provide the required bitline voltage in the memory device.

Figure 2:
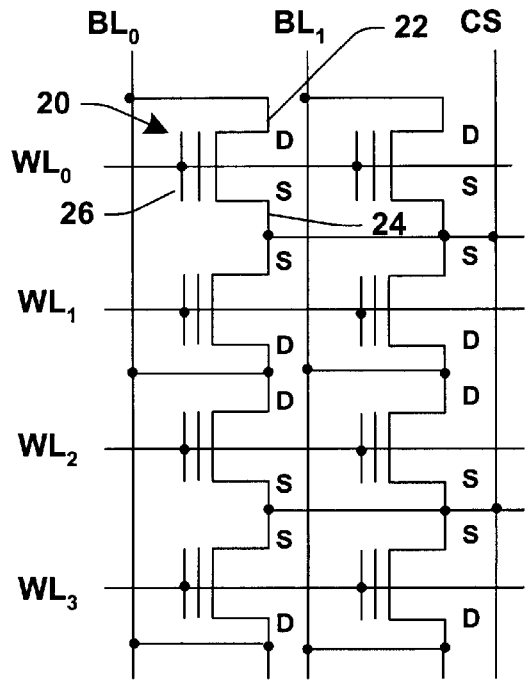
FIG. 2 is a schematic diagram illustrating an exemplary core portion of a memory circuit.

Referring initially to FIGS. 1 and 2, semiconductor memory devices typically include multiple individual components formed on or within a substrate. Such devices often comprise a high density section and a low density section. For example, as illustrated in prior art FIG. 1, a memory device such as a flash memory 10 comprises one or more high density core regions 12 and a low density peripheral portion 14 on a single substrate 16. The high density core regions 12 typically include at least one M×N array of individually addressable, substantially identical memory cells and the low density peripheral portion 14 typically includes input/output (I/O) circuitry and circuitry for selectively addressing the individual cells (such as decoders for connecting the source, gate and drain of selected cells to predetermined voltages or impedances to enable designated operations of the cell such as programming, reading or erasing).

The memory cells within the core portion 12 are coupled together in a circuit configuration, such as a NOR configuration illustrated in FIG. 2. Each memory cell 20 has a drain 22, wherein the drains of more than one cell are connected to a common bitline, a source 24, and a stacked gate 26. Each stacked gate 26 is coupled to a wordline ($WL_0$, $WL_1$, ..., $WL_N$) while each drain 22 is coupled to a bitline ($BL_0$, $BL_1$, ..., $BL_N$). Lastly, each source 24 is coupled to a common source line CS. Using peripheral decoder and control circuitry (not shown), each memory cell 20 may be addressed for programming, reading or erasing functions, in a fashion known in the art.

Figure 3:
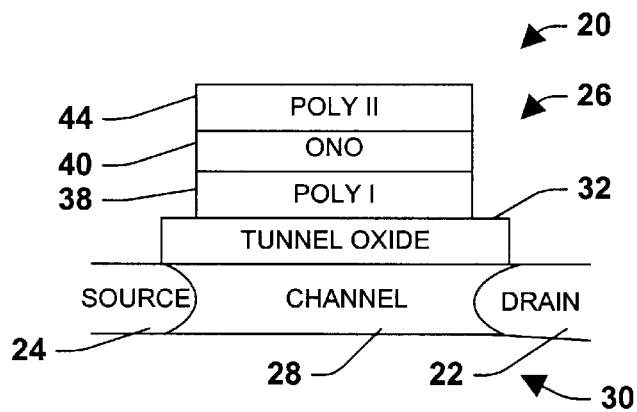
FIG. 3 is a partial cross-sectional view of a conventional stacked gate memory cell.

FIG. 3 provides a cross-sectional illustration of a typical memory cell 20 in the core region 12 of FIGS. 1 and 2. Such a memory cell 20 typically includes the source 24, the drain 22 and a channel 28 in a substrate 30; and the stacked gate structure 26 overlying the channel 28. The stacked gate 26 includes a thin gate dielectric layer 32 (commonly referred to as the tunnel oxide) formed on the surface of the substrate 30. The tunnel oxide layer 32 coats a portion of the top surface of the silicon substrate 30 and serves to support an array of different layers directly over the channel 28. The stacked gate 26 includes a lower most or first film layer 38, such as doped polycrystalline silicon (polysilicon or poly I) layer which serves as a floating gate 38 that overlies the tunnel oxide 32. Note that the various portions of the transistor 20 highlighted above are not drawn to scale in FIG. 3, but rather are illustrated as such for ease of illustration and to facilitate an understanding of the device operation.

Above the poly I layer 38 is an interpoly dielectric layer 40. The interpoly dielectric layer 40 is often a multilayer insulator such as an oxide-nitride-oxide (ONO) layer having two oxide layers sandwiching a nitride layer, or in the an alternative can be another dielectric layer such as tantalum pentoxide. Finally, the stacked gate 26 includes an upper or second polysilicon layer (poly II) 44 which serves as a polysilicon control gate overlying the ONO layer 40. The control gates 44 of the respective cells 20 that are formed in a given row share a common wordline (WL) associated with the row of cells (see, e.g., FIG. 2). In addition, as highlighted above, the drain regions 22 of the respective cells in a vertical column are connected together by a conductive bitline (BL). The channel 28 of the cell 20 conducts current between the source 24 and the drain 22 in accordance with an electric field developed in the channel 28 by the stacked gate structure 26.

The memory cell 20 is programmed by applying a relatively high gate voltage $V_G$ to the control gate 38 and a moderately high drain voltage $V_D$ to the drain 22 in order to produce "hot" (high energy) electrons in the channel 28 near the drain 22. The hot electrons accelerate across the tunnel oxide 32 and into the floating gate 34, which become trapped in the floating gate 38 because the floating gate 38 is surrounded by insulators (the interpoly dielectric 40 and the tunnel oxide 32). As a result of the trapped electrons, a threshold voltage ($V_T$) of the memory cell 20 increases. This change in the threshold voltage (and thereby the channel conductance) of the memory cell 20 created by the trapped electrons is what causes the memory cell 20 to be programmed.

To read the memory cell 20, a predetermined gate voltage greater than the threshold voltage of an unprogrammed memory cell, but less than the threshold voltage of a programmed memory cell, is applied to the control gate 44. If the memory cell 20 conducts (e.g., a sensed current in the cell exceeds a minimum value), then the memory cell 20 has not been programmed (the memory cell 20 is therefore at a first logic state, e.g., a zero "0"). Conversely, if the memory cell 20 does not conduct (e.g., the current through the cell does not exceed a threshold value), then the memory cell 20 has been programmed (the memory cell 20 is therefore at a second logic state, e.g., a one "1"). Thus, each memory cell 20 may be read in order to determine whether it has been programmed (and therefore identify the logic state of the data in the memory cell 20).

In order to erase the memory cell 20, a relatively high source voltage $V_S$ is applied to the source 24 and the control gate 44 is held at approximately ground potential ($V_G=0$ volts), while the drain 22 is allowed to float. Under these conditions, a strong electric field is developed across the tunnel oxide 32 between the floating gate 38 and the source region 24. The electrons that are trapped in the floating gate 38 flow toward and cluster at the portion of the floating gate 38 overlying the source region 24 and are extracted from the floating gate 38 and into the source region 22 by way of Fowler-Nordheim tunneling through the tunnel oxide 32. Consequently, as the electrons are removed from the floating gate 38, the memory cell 20 is erased.

It is thus seen that appropriate voltages must be applied to the various terminals (e.g., source, drain, and gate) of the cells 20 in the memory device 10 in order to perform various operations (e.g., program, erase, read) associated with the device 10. However, as stated above, the applied voltages have heretofore been derived from the source voltage to which the device 10 is connected. Where such a supply voltage is not high enough to supply the voltages required to perform such operations, however, the device 10 may be rendered inoperative or inapplicable in certain systems. This condition may result in low power applications of the memory device 10, for instance, in portable device applications wherein the supply voltage may be low. Alternatively, the memory cells in a memory device may comprise dual bit architectures requiring higher bitline voltages at the drain of the individual cells in order to properly perform read operations. The present invention overcomes or minimizes these problems by the provision of a voltage booster to boost the bitline voltage in conditions where the supply voltage is insufficient to allow proper read operations.

Figure 4:
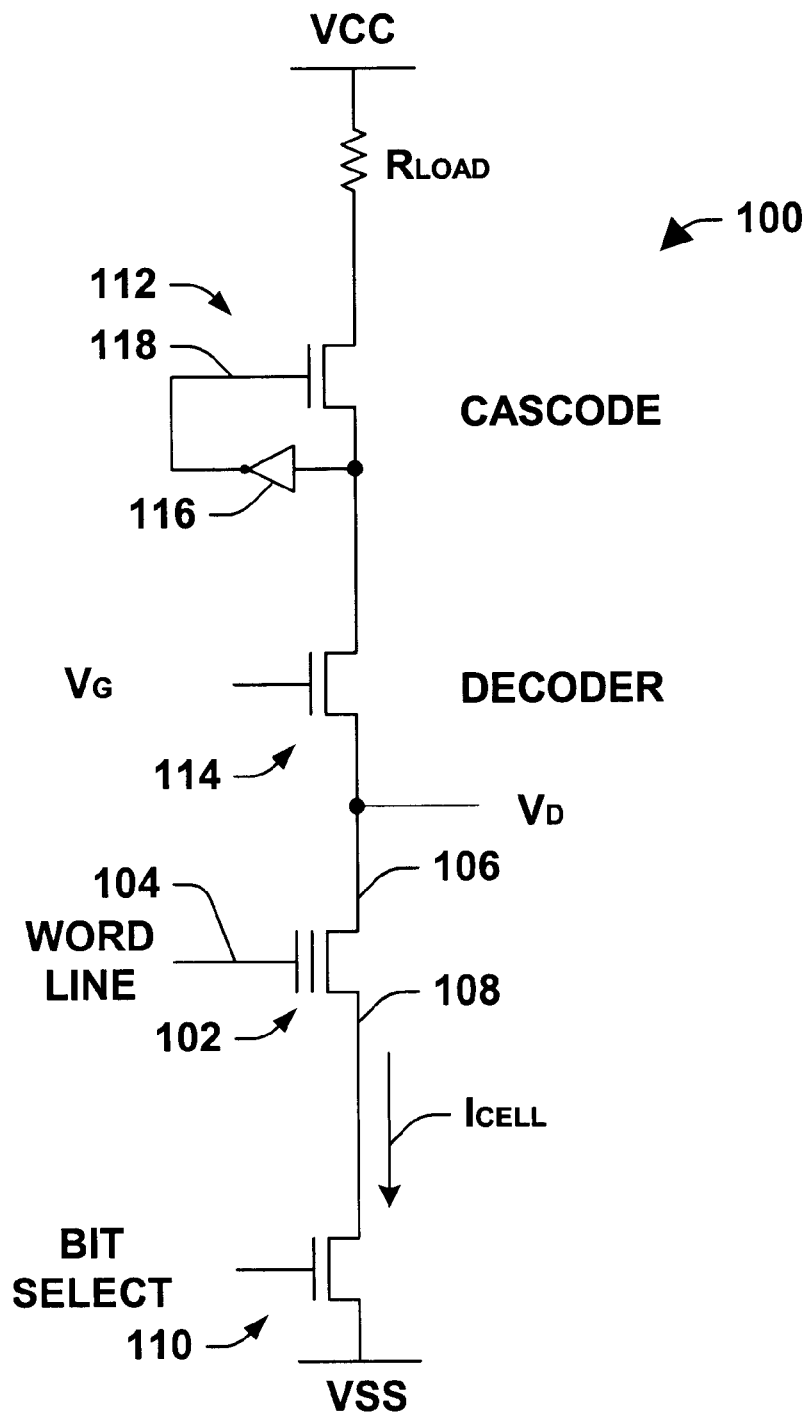
FIG. 4 is a schematic illustration of a portion of a memory device including a memory cell and associated decoding and cascode circuitry.

Referring now to FIG. 4, a portion of an exemplary memory device 100 is illustrated having a memory cell 102 comprising a MOS transistor, which may be adapted to store two bits of binary data (e.g., a dual bit cell). The cell 102 has three terminals 104, 106, and 108, comprising a gate, a drain, and a source, respectively, wherein the gate 104 is connected to a wordline, the source 108 is connected to a bit select transistor device 110 for applying a source voltage VSS to the source 108 in dual bit operation, and the drain 106 is connected to a bitline $V_D$. During a read operation to ascertain the data stored in the cell 102, a bitline voltage is applied to the bitline terminal $V_D$, and a gate voltage is applied to the gate 104 by wordline selection circuitry (not shown), and a current $I_{CELL}$ is measured by read circuitry (not shown). The amount or magnitude of the current $I_{CELL}$ is used to indicate the data (e.g. binary "1" or "0") stored in the cell 102.

Where the cell 102 is a single bit, stacked gate type, the bitline voltage $V_D$ required for proper reading of the cell 102 is typically about 0.5 to 1.0 volts. The voltage applied at the bitline (e.g., at the drain terminal 106 of the cell 102) is determined in the device 100 by a supply voltage VCC. The supply voltage VCC is connected through a load resistance $R_{LOAD}$ to the drain 106 via a cascode circuit 112 and a decoder circuit 114, wherein the cascode circuit 112 is used to provide a regulated bitline voltage $V_D$ to the drain 106 during a read operation, and the decoder 114 is used to select the word or other grouping of cells of which the memory cell 102 is a member. The cascode circuit 112 comprises an inverting amplifier 116 operative to provide feedback to a gate 118 of the cascode circuit 112, whereby the cascode circuit 112 operates as a variable resistor tuned to provide a regulated voltage from the supply voltage VCC to the bitline $V_D$ through the decoder 114 in a read operation of the cell 102.

Where the supply voltage VCC is at a sufficiently high voltage level (e.g., 5 volts), the read operation may accordingly provide the proper bitline voltage (e.g., 0.5 to 1.0 volts) at the drain 106 for a single bit cell 102. However, where the device 100 is employed in a low power application or system, the supply voltage VCC may be insufficient to provide the necessary bitline voltage. For example, the device 100 may be operated with a supply voltage VCC of only 2 volts, whereby the drops across the load resistance $R_{LOAD}$, the cascode circuit 112, and the decoder 114 leave insufficient voltage to provide the necessary 0.5 to 1.0 volts for reading the cell 102.

Another problem may occur where the cell 102 of the device 100 is a dual bit memory cell, which requires 1.5 to 2.0 volts at the drain 106 in order to be read properly. In this situation, the above mentioned voltage drops across the load resistance $R_{LOAD}$, the cascode circuit 112, and the decoder 114 may also leave insufficient voltage to provide the necessary 1.5 to 2.0 volts for reading the cell 102, even where VCC is at 5 volts. In addition, dual bit architecture devices such as device 100 may need to be operated at lower VCC levels, for example, in low power systems. As illustrated and described below, the invention provides an apparatus and methodology by which these difficulties are minimized or overcome by the provision of a voltage booster to boost the level of the bitline in a memory read operation.

Figure 5:
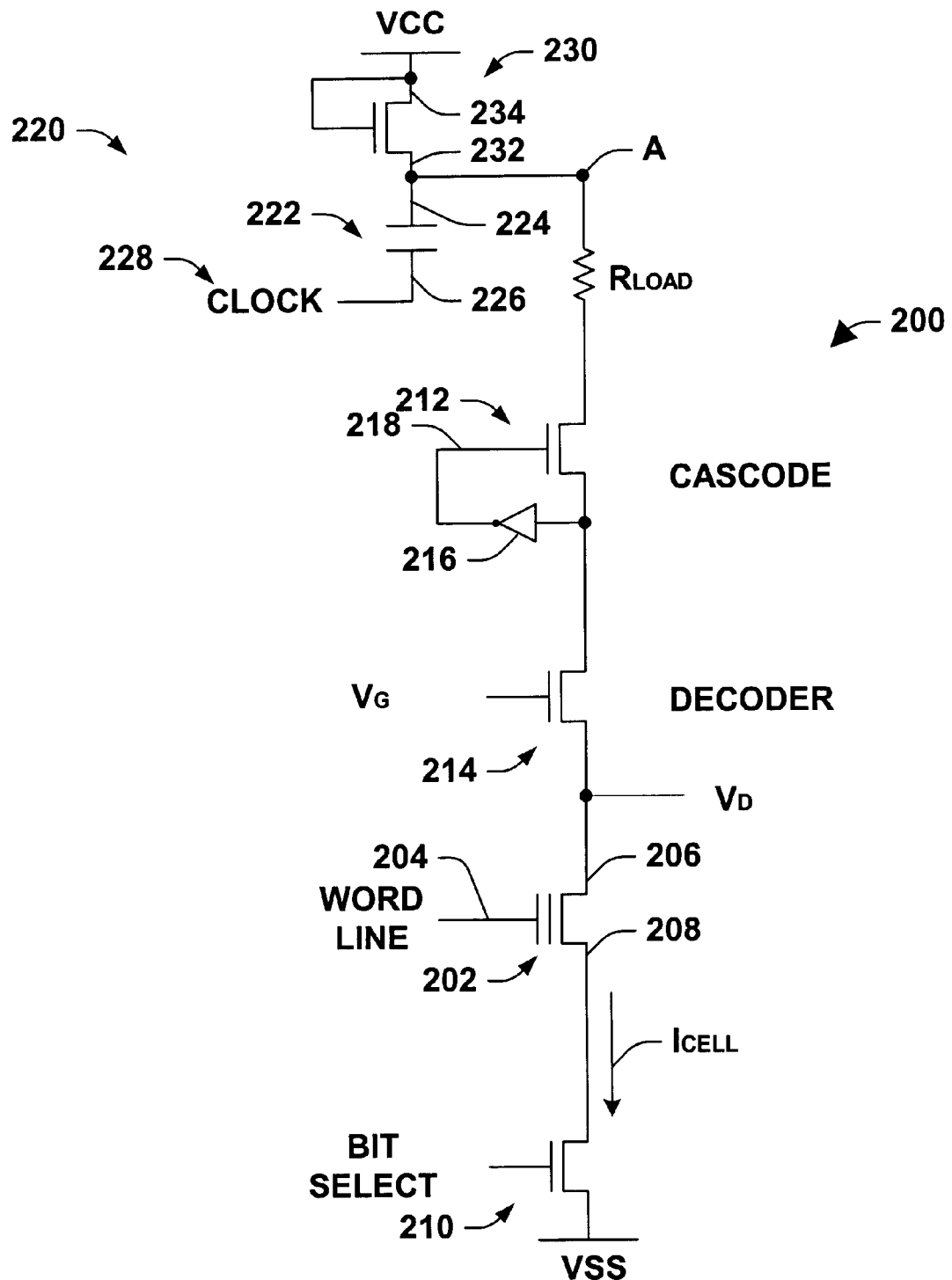
FIG. 5 is a schematic illustration of a memory device including an exemplary voltage booster for reading a memory cell in association with an aspect of the present invention.

Referring now to FIG. 5, an exemplary memory device 200 is illustrated in accordance with an aspect of the invention, which comprises a memory cell 202 in electrical communication with a node A, and operative to indicate a binary value associated with data stored in the memory cell during a read operation when a first voltage, such as a bitline voltage $V_D$, is applied to the cell 202. For instance, where the cell 202 is a single bit, stacked gate architecture, the first voltage may be approximately 0.5 to 1.0 volts in order to properly read the cell data. When the proper first voltage is applied to the bitline of the cell 202, and an appropriate gate voltage is applied to the cell 202 (e.g., between a programmed threshold voltage and an unprogrammed threshold voltage), the resulting current $I_{CELL}$ is sensed in order to determine the data stored in the cell 202. A load resistor $R_{LOAD}$ is provided in the current path of $I_{CELL}$. The cell 202 may alternatively be a dual bit cell, in which case the required first voltage (e.g., bitline voltage) may be approximately 1.5 to 2.0 volts.

The cell 202 comprises a three terminal MOS transistor, which may be adapted to store two bits of information, having a gate 204 connected to a wordline for selection of the word or group of cells in which the cell 202 is a member, a drain 206 connected to a bitline $V_D$, and a source 208 connected to a source voltage VSS through a bit select device 210. The device 200 further comprises cascode circuit 212 and a decoder circuit 214, wherein the cascode circuit 212 comprises an inverting amplifier 216 providing feedback to a gate 218 of the cascode circuit 212 to regulate a bitline voltage applied to the cell 202 during a read operation, similar to the operation of the cascode circuit 112 of FIG. 4.

The memory device 200 further comprises a voltage booster 220 connected between node A and a supply voltage VCC, which provides a boosted voltage to node A during a read operation, wherein the boosted voltage at node A is greater than the supply voltage VCC. In this manner, the first voltage may be applied to the memory cell 202 via the voltage booster 220 during the read operation, wherein the first voltage (e.g., the bitline voltage $V_D$) is the required bitline read operation voltage for the cell 202. The voltage booster 220 comprises a capacitor 222 having a first terminal 224 connected to node A and a second terminal 226 connected to a first signal, such as a clock signal 228. The voltage booster 220 further comprises a switch 230 (e.g., a diode-connected transistor) having a first terminal 232 connected to node A and a second terminal 234, connected to the supply voltage VCC.

The first signal 228 has a first state where a voltage approximately equal to the supply voltage VCC is applied to the second terminal 226 of the capacitor 222 and a second state where, for example, approximately a zero voltage is applied to the terminal 226, wherein the signal 228 is connected to VCC through a clock or single shot pulse generation circuit (not shown) in the first state, and grounded in the second state. The switch 230 disconnects node A from the supply voltage VCC when the first signal 228 is in the first state (e.g., the diode-connected transistor is reverse biased), and connects node A with VCC when the first signal is in the second state (e.g., the diode-connected transistor is forward biased). In this fashion, node A is at approximately the supply voltage VCC when the signal 228 is in the second state, and at a boosted voltage value greater than VCC when the signal 228 is in the first state. Thus, the invention provides a boosted voltage (e.g., above VCC) to node A in order to provide the appropriate bitline voltage $V_D$ to the drain 206 of cell 202 during a read operation.

By the operation of the switch 230 (which behaves as a diode-connected transistor) and the signal 228, the capacitor 222 acquires a voltage approximately equal to VCC when signal 228 is in the second state, and the capacitor 222 boosts the voltage at node A above VCC when signal 228 is in the first state. The signal 228 may be provided as a single pulse during the read operation to successively charge the capacitor 222 and then to connect the capacitor so as to boost the node A voltage. Alternatively, the signal 228 may be generated by a clock circuit (not shown), which operates continuously in a charge-boost fashion. Other forms of the first signal 228 are contemplated as falling within the scope of the present invention, whereby a boosted voltage may be applied to properly read the cell 202.

Figure 6:
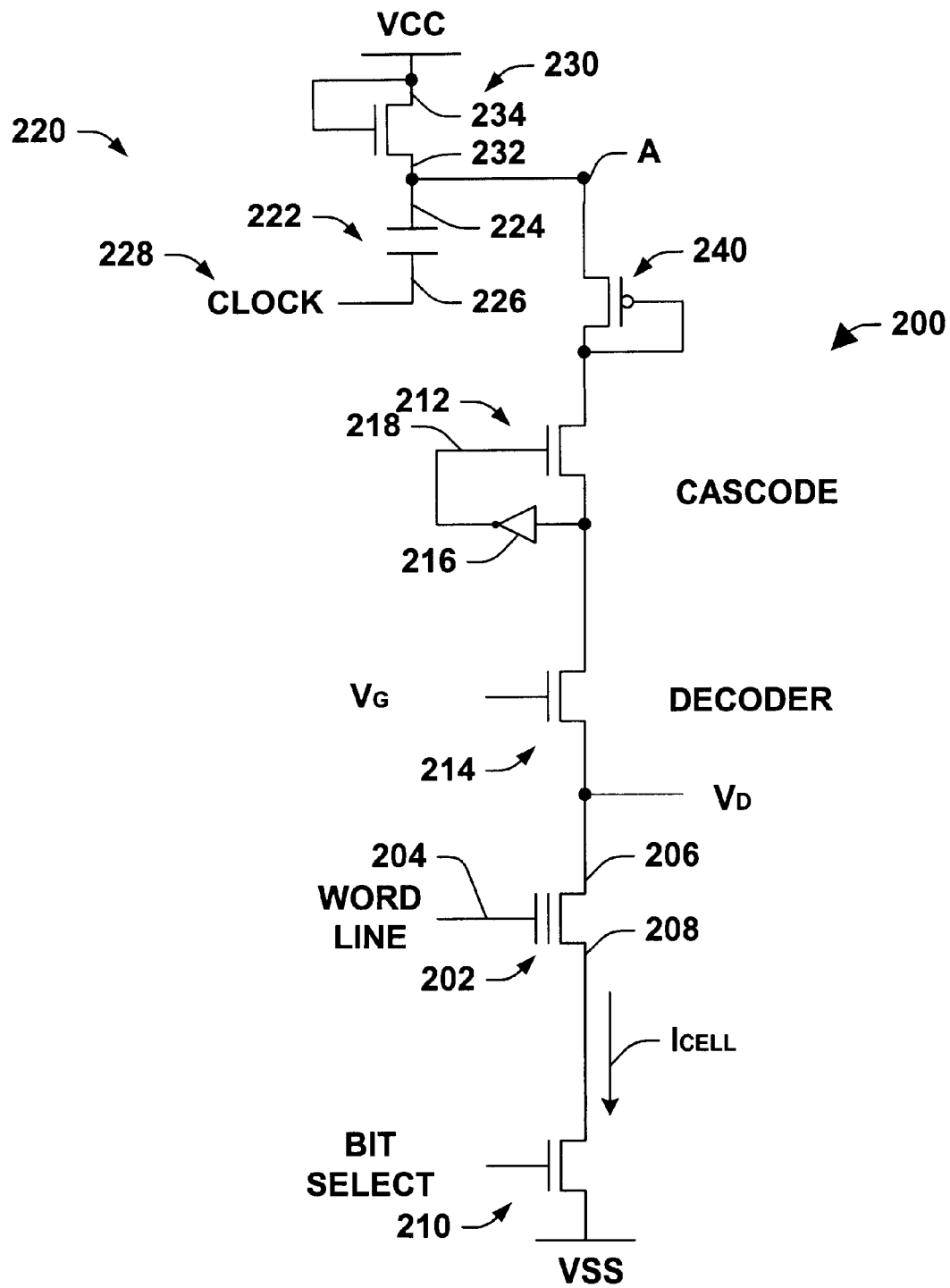
FIG. 6 is a schematic illustration of another exemplary memory device in accordance with the invention.

Referring also to FIG. 6, the load for the cell current $I_{CELL}$ may be provided by a P channel MOS device 240 instead of a load resistor (e.g., resistor $R_{LOAD}$ of FIG. 5). The invention thus provides the boosted voltage at node A by which a regulated first voltage (e.g., bitline voltage $V_D$ applied to the drain 206 of the cell 202) is provided during a read operation. The amount of voltage boost at node A may be determined according to the bitline voltage requirements of a particular cell architecture (e.g., single bit or dual bit) and/or according to the rated supply voltage range for the memory device 200. Thus, a wide range of supply voltages may be supported, and in addition, different cell architecture types having different bitline read voltage requirements may be supported in accordance with the invention. In addition, it will be appreciated that the timing requirements for the signal 228 as well as the sizing of the capacitor 222 may be adjusted to account for different read cycle durations, as well as to accommodate various ranges of cell current $I_{CELL}$.

Figure 7:
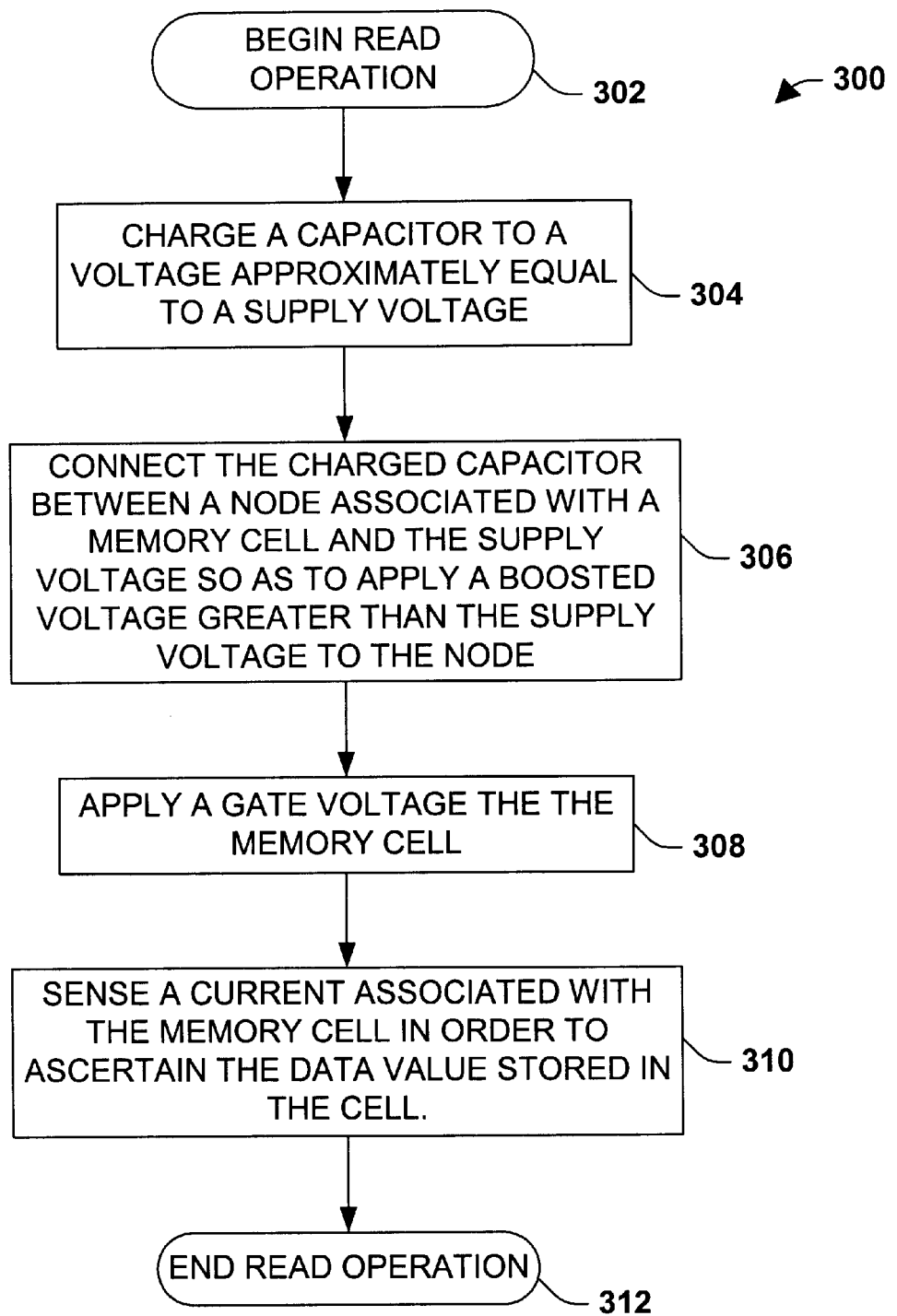
FIG. 7 is a flow diagram illustrating an exemplary method of reading data stored in a memory cell in accordance with another aspect of the invention.

Another aspect of the invention provides a methodology for reading data stored in a memory cell in a memory device, which may be employed in association with the memory devices illustrated and described herein, as well as with other memory devices. Referring now to FIG. 7, an exemplary method 300 is illustrated for reading data stored in a memory cell in a memory device. While the exemplary method 300 is illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the method 300 may be implemented in association with the apparatus and systems illustrated and described herein as well as in association with other systems not illustrated.

The method 300 comprises applying a boosted voltage to a node in electrical communication with the memory cell, wherein the boosted voltage is greater than a supply voltage, and sensing a current associated with the memory cell in order to indicate a binary value associated with data stored in the memory cell during a read operation. Beginning at step 302, a capacitor is charged to a first voltage, for example, a voltage approximately equal to a supply voltage at 304. At 306, the charged capacitor is connected between a node associated with a memory cell (e.g., node A associated in FIGS. 5 and 6 with memory cell 202), and another voltage, for example, the supply voltage (e.g., VCC), in order to apply a boosted voltage to the node, wherein the boosted voltage is greater than the supply voltage.

At 308, an appropriate gate voltage is applied to the memory cell (e.g., to the gate terminal 204 of cell 202 by a wordline circuit), and thereafter a current resulting from the applied voltages is sensed at 310 in order to ascertain the data value stored in the memory cell. The read operation thereafter ends at 312, and the method 300 may be repeated for subsequent read operations of the memory device. The methodology 300 thus provides for appropriate applied voltages in the memory device by the provision of boosted voltages at a node associated with the memory cell of interest via a charged capacitor. Other variants of methodologies may be provided in accordance with the present invention, whereby a boosted voltage is applied to a node in electrical communication with the memory cell.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. A memory device having a plurality of memory cells adapted to store data, comprising:
   at least one memory cell in electrical communication with a node, and operative to indicate a binary value associated with data stored in the memory cell during a read operation when a first voltage is applied to the memory cell as a bitline voltage; and
   a voltage booster connected between the node and a supply voltage and operative to provide a boosted voltage to the node during the read operation, wherein the boosted voltage is greater than the supply voltage, and wherein the first voltage is a function of the boosted voltage.

2. The memory device of claim 1, wherein the voltage booster comprises a capacitor having a first terminal coupled to the node and a second terminal coupled to a first signal, and a switch having a first terminal coupled to the node and a second terminal coupled to the supply voltage;
   wherein the first signal has a first state where a positive voltage is applied to the second terminal of the capacitor and a second state where approximately a zero voltage is applied to the second terminal of the capacitor; and
   wherein the switch disconnects the node from the supply voltage when the first signal is in the first state and connects the node with the supply voltage when the first signal is in the second state, whereby the node is at approximately the supply voltage when the first signal is in the second state, and the node is at the boosted voltage greater than the supply voltage when the first signal is in the first state.

3. The memory device of claim 2, wherein the positive voltage comprises a voltage approximately equal to the supply voltage.

4. The memory device of claim 2, wherein the capacitor acquires a voltage approximately equal to the supply voltage when the first signal is in the second state, and the capacitor boosts the voltage at the node above the supply voltage when the first signal is in the first state.

5. The memory device of claim 4, further comprising a decoder connected between the node and the at least one memory cell, and adapted to select the at least one memory cell during the read operation.

6. The memory device of claim 5, wherein the voltage booster comprises a clock circuit providing the first signal.

7. The memory device of claim 2, wherein the voltage booster comprises a clock circuit providing the first signal.

8. The memory device of claim 1, wherein the voltage booster comprises a capacitor operative to provide the boosted voltage to the node during the read operation.

9. The memory device of claim 8, wherein the voltage booster further comprises a switch operative to selectively apply a first voltage approximately equal to the supply voltage to a first terminal of the capacitor in a first switch state in order to charge the capacitor to approximately the supply voltage, and a first signal operative to selectively apply a second voltage approximately equal to the supply voltage to a second terminal of the capacitor in a second switch state in order to provide the boosted voltage to the node during the read operation.

10. The memory device of claim 9, further comprising a decoder connected between the node and the at least one memory cell, and adapted to select the at least one memory cell during the read operation.

11. The memory device of claim 10, wherein the at least one memory cell comprises a dual bit memory cell adapted to store two bits of data.

12. The memory device of claim 1, further comprising a decoder connected between the node and the at least one memory cell, and adapted to select the at least one memory cell during the read operation.

13. The memory device of claim 12, wherein the at least one memory cell comprises a dual bit memory cell adapted to store two bits of data.

14. A method of reading data stored in a memory cell in a memory device, comprising:

applying a boosted voltage to a node in electrical communication with the memory cell, wherein the boosted voltage is greater than a supply voltage; and sensing a current associated with the memory cell using the boosted voltage in order to indicate a binary value associated with data stored in the memory cell during a read operation;

wherein applying the boosted voltage to the node comprises:

charging a capacitor having a first terminal associated with the node to a voltage approximately equal to the supply voltage; and coupling the capacitor between the node and a positive voltage, wherein the first terminal of the capacitor is coupled to the voltage which is approximately equal to the supply voltage, and a second terminal of the capacitor is coupled to the positive voltage, wherein the first terminal is boosted to a voltage which is greater than the supply voltage.

15. The method of claim 14, wherein the positive voltage is approximately equal to the supply voltage.

16. The method of claim 14, wherein charging the capacitor and coupling the capacitor between the node and the positive voltage is repeated for each read operation.

17. The method of claim 14, wherein charging the capacitor comprises applying a voltage approximately equal to the supply voltage across the capacitor.

18. A memory device having a plurality of memory cells adapted to store data, comprising:

at least one memory cell in electrical communication with a node, and operative to indicate a binary value associated with data stored in the memory cell during a read operation when a first voltage is applied to the memory cell as a bitline voltage; and means for providing a boosted voltage to the node during the read operation, wherein the boosted voltage is greater than a supply voltage, whereby the first voltage is applied to the at least one memory cell during the read operation, and wherein the first voltage is a function of the boosted voltage.

19. The memory device of claim 18, wherein the means for providing a boosted voltage comprises a capacitor having a first terminal connected to the node and a second terminal connected to a first signal, and a switch having a first terminal connected to the node and a second terminal connected to the supply voltage;

wherein the first signal has a first state where a voltage approximately equal to the supply voltage is applied to the second terminal of the capacitor and a second state where approximately zero voltage is applied to the second terminal of the capacitor; and wherein the switch disconnects the node from the supply voltage when the first signal is in the first state and connects the node with the supply voltage when the first signal is in the second state, whereby the node is at approximately the supply voltage when the first signal is in the second state, and the node is at the boosted voltage when the first signal is in the first state.

20. The memory device of claim 19, wherein the capacitor acquires a voltage approximately equal to the supply voltage when the first signal is in the second state, and the capacitor boosts the voltage at the node above the supply voltage when the first signal is in the first state.

* * * * *